United States Patent
Lin

(10) Patent No.: US 6,534,412 B1
(45) Date of Patent: Mar. 18, 2003

(54) METHOD FOR REMOVING NATIVE OXIDE

(75) Inventor: Benjamin Szu-Min Lin, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/686,250

(22) Filed: Oct. 11, 2000

(51) Int. Cl.[7] ............................................. H01L 21/302
(52) U.S. Cl. ....................... 438/706; 438/710; 438/712
(58) Field of Search ................................ 438/706, 710, 438/712; 134/1.2, 1.3; 427/534, 535, 542

(56) References Cited

U.S. PATENT DOCUMENTS 4,940,505 A * 7/1990 Schachameyer et al. .... 156/345
5,923,966 A * 7/1999 Teramoto et al. ........... 438/162
5,968,279 A * 10/1999 MacLeish et al. ........... 134/1.2

* cited by examiner

Primary Examiner—Robert Kunemund
Assistant Examiner—Lan Vinh

(57) ABSTRACT

A method for removing a native oxide layer using hydrogen to react with the native oxide layer is described. Oxygen atoms in silicon dioxide is replaced to achieve the purpose of native oxide removal. Additionally, laser enhancement is used to lower the reaction temperature to between 200°–700° C. The purpose of low-temperature native oxide removal is thus achieved.

6 Claims, 1 Drawing Sheet

METHOD FOR REMOVING NATIVE OXIDE

BACKGROUND OF THE INVENTION

1. Field of the Invention

The present invention relates to pre-treatment process prior to a thin film deposition. More particularly, the present invention relates to method for removing native oxide.

2. Description of the Related Art

In the fabrication of integrated circuits, surface purity has a critical influence on the quality of subsequent processing steps (such as forming a gate oxide layer, depositing HSG, or a metal layer). Thus, it is necessary to perform a pre-treatment process before subsequent processing steps, in order to remove organic and inorganic materials, subatomic particles and native oxide attached to the silicon surface. Most pretreatment steps include acid wash, alkaline wash, chemical oxidation and diluted hydrofluoric acid treatments.

Native oxide refers to the silicon oxide ($SiO_2$) layer that forms on the surface of a wafer resulted from the oxidation of silicon atoms when the wafer has been exposed to an oxide-containing environment such as oxygen or water. Since the silicon oxide layer is formed naturally with water vapor or oxygen present in the air, it is called native oxide. This native oxide layer has a harmful effect on the quality of the thin film (HSG, metal silicide) formed in a subsequent step. Thus, in most semiconductor fabrication processes, a pre-treatment step is carried out to remove native oxide from the surface of the silicon wafer before forming the thin film. In this way a better quality thin film is attained in the latter stages of the fabrication process.

Currently, there are not many good methods for removing native oxide. The methods described below are the most suitable ones in use at the present time. One method uses gaseous plasma such as Argon (Ar) plasma to etch away the native oxide layer on the surface of a silicon wafer. However, a plasma causes damage to the silicon surface. Another method uses hydrogen gas to replace the oxygen in the native oxide, restoring silicon oxide to silicon. Using hydrogen atoms does not cause as much damage to the silicon surface. However, the method using hydrogen atoms requires that the temperature be raised to more than 700 degree Celsius. At such a high temperature, amorphous silicon will be transformed into polysilicon. Thus, this method can not be used to remove native oxide on the surface of amorphous silicon. Additionally, high temperature also alters the shape of the P/N junction in the substrate, which has a harmful effect on the conductivity of the device. Moreover, after the native oxide layer has been removed, the silicon wafer must be removed from the vacuum of the reaction chamber. When the silicon wafer once again comes into contact with air, the surface will be oxidized by the oxygen components in the air, creating a second native oxide layer.

SUMMARY OF THE INVENTION

As embodied and broadly described herein, the invention provides a method for removing native oxide, wherein the method uses hydrogen to react with the native oxide layer, displacing the oxygen atoms in silicon dioxide and thus achieving the goal of native oxide removal. Additionally, ultra-violet (UV) laser irradiation enhancement is used to reduce the reaction temperature to approximately between about 200° and about 700° C. Thus, the goal of low-temperature native oxide removal can be attained.

The invention provides a thin film deposition pre-treatment step used to remove native oxide on the surface of a substrate, comprising the steps below. A semiconductor substrate is placed in a reaction chamber, wherein the pressure in the chamber is approximately between $10^{-6}$–$10^{-2}$ torr. The substrate is heated to between 200° and 700° C. Hydrogen is passed through the reaction chamber and the substrate is irradiated with an UV laser. After the aforementioned treatment process has been conducted, the substrate can be transported to another reactor without exposing to air where thin film deposition is performed. As a consequence, a second native oxide is prevented from forming which enables the goal of a preferred film to be attained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings, FIG. 1. is a schematic drawing illustrating an apparatus used to remove native oxide according to a preferred embodiment of the invention.

DESCRIPTION OF THE PREFERRED EMBODIMENTS

Figure 1:
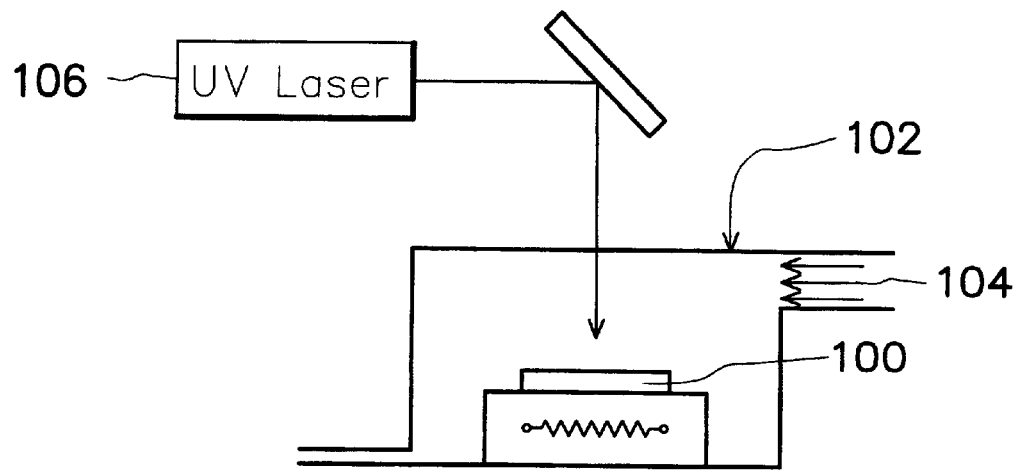

FIG. 1 illustrates an apparatus for removing native oxide according to one preferred embodiment of this invention. As shown in FIG. 1, a silicon wafer 100 is placed in a reaction chamber 102. Because the silicon wafer 160 has been exposed to air, a native oxide layer has formed on the wafer surface. A gas 104 (hydrogen for example) is passed through the reaction chamber 102, so that the molecules of the gas 104 come into contact with the surface of silicon wafer 100. The surface of silicon wafer 100 is irradiated by an UV irradiation enhancement laser 106. At the same time, the silicon wafer is heated-up a temperature of about 200 degrees Celsius to about 700 Celsius. A hot plate, for example, can be used as the method for heating. Due to the synergetic effect of the laser, hydrogen would restore the native oxide layer on the surface of the silicon wafer 100 a silicon surface. In this manner, the purpose of removing the native oxide layer is achieved.

It is worth noting that the pressure of the reaction chamber according to a preferred embodiment of this invention is controlled approximately between $1 \times 10^{-2}$ and $1 \times 10^{-6}$ torr. This is because when the pressure is lower than $1 \times 10^{-6}$ torr, the restoring of silicon dioxide to silicon can not take place or the speed of the reaction proceeds too slowly. On the other hand, when the pressure is greater than $1 \times 10^{-2}$ torr, it is difficult to control the purity of the gas because contaminants are easily introduced.

The preferred method to assure that the silicon wafer surface will not be re-oxidized by oxygen in the air or vapor is to maintain the silicon wafer from being exposed to air before the thin film deposition process, once the native oxide is removed from the silicon wafer surface.

Figure 2:
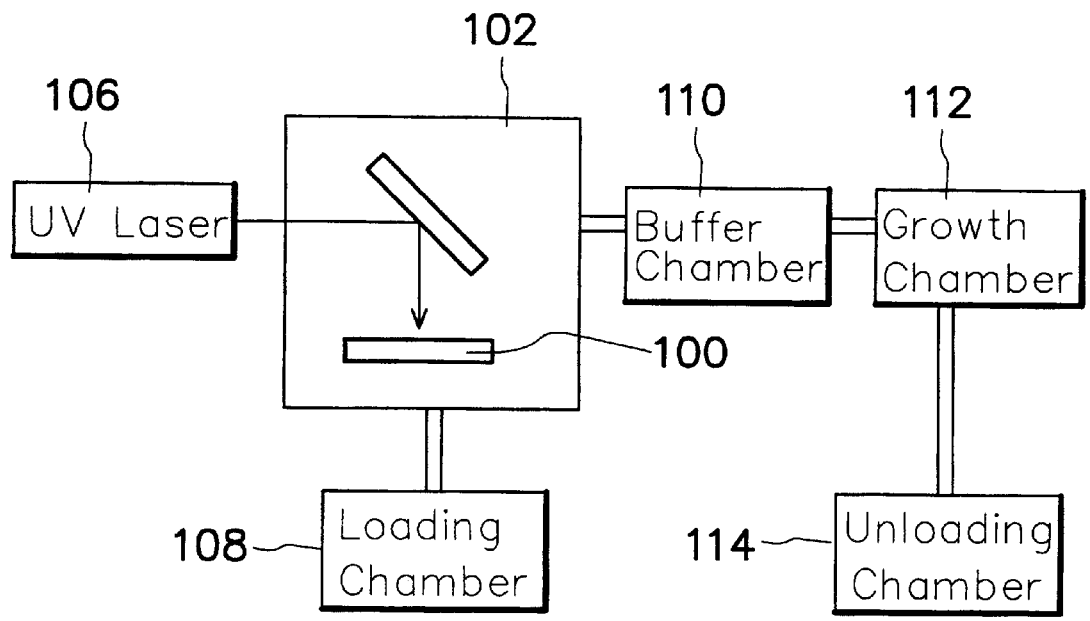
FIG. 2 is a schematic drawing showing the relative connectiive of the reaction chambers of the apparatuse used in removing native oxide according to a preferred embodiment of the invention.

FIG. 2 illustrates the relative connection of the reaction chambers used an apparatus used for removing native oxide according to one preferred embodiment of this invention. For the sake of convenience, the same reference numbers are used to refer to parts in FIG. 2 and FIG. 1 that are functionally similar.

As shown in FIG. 2, after having been rinsed, the silicon wafer 100 with a native oxide layer to be removed is first delivered into a reaction chamber 102 via a loading chamber 108. The removal of native oxide, as described in the above, is conducted in the reaction chamber 102. The silicon wafer 100 is then passed to a buffer chamber 110 where it is stored until the growth chamber 112 is vacant. When the growth chamber 112 is available, the silicon wafer 100 is sent to the growth chamber 112 where deposition is performed. After the deposition has been completed, the silicon wafer 100 leaves the apparatus via the unloading chamber 114.

Throughout the entire process described above, that is to say, between the points where the silicon wafer enters the loading chamber 108 and exits through the unloading chamber 114, at no time the silicon wafer comes into contact with air. Thus, native oxide is prevented from forming a second time.

Accordingly, using hydrogen to react with native oxide could replace the oxide atoms in silicon dioxide, resulting in the removal of the native oxide and preventing damage being induced on the substrate. Additionally, the laser enhance method allows the reaction temperature to fallbetween 200° and 700° C. Lower temperature removal of native oxide can be achieved. Consequently, no negative effect is resulted with regards to the efficiency of the device. Moreover, the silicon wafer, after the native oxide has been removed and before the thin film is deposited is maintained in a vacuum and prevented from being exposed to air. As a result, native oxide does not form a second time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film deposition pre-treatment process, used to remove a native oxide layer formed on top of a substrate, sequentially comprising:

placing the substrate in a reaction chamber;

supplying a hydrogen gas to the reaction chamber so that molecules of the hydrogen gas come in contact with the native oxide layer;

heating to the substrate; and projecting a laser onto a surface of the substrate, wherein the hydrogen gas reacts with the native oxide layer at a temperature of 200° C.–700° C. to displace an oxygen atom in the native oxide layer.

2. The pre-treatment process of claim 1, wherein the gas includes hydrogen.

3. The pre-treatment process of claim 1, wherein the substrate is heated to a temperature of about 200° to about 700° C.

4. The pre-treatment process of claim 1, wherein the pressure of the reaction chamber is about $10^{-6}$ torr to about $10^{-2}$ torr.

5. The pre-treatment process of claim 1, wherein the pressure of the reaction chamber is about between $10^{-6}$ to about $10^{-2}$ torr.

6. The pre-treatment process of claim 1, wherein the laser includes an ultra-violet (UV) light.

\* \* \* \* \*